United States Patent [19]

Ingold et al.

[11] Patent Number: 4,581,603
[45] Date of Patent: Apr. 8, 1986

[54] SWITCH MATRIX KEY CLOSURE VALIDATION DEVICE AND METHOD

[75] Inventors: William E. Ingold, Coon Rapids; Dominic J. Daninger, Blaine, both of Minn.

[73] Assignee: The Maxi-Switch Company, Minneapolis, Minn.

[21] Appl. No.: 474,558

[22] Filed: Mar. 11, 1983

[51] Int. Cl.⁴ .......................... H04L 3/00; G08B 5/36
[52] U.S. Cl. ........................... 340/365 E; 340/365 R; 340/365 S
[58] Field of Search ........................ 340/365 E, 365 S; 178/17 C; 84/1.01, 1.11, 1.12, 1.13, 1.14, 1.19

[56] References Cited

U.S. PATENT DOCUMENTS

| | | |
|---|---|---|
| 3,585,637 | 6/1971 | Jones . |
| 3,660,826 | 5/1972 | Lins . |
| 3,745,536 | 7/1973 | Klehm . |
| 3,900,845 | 8/1975 | Tsuiki et al. . |
| 3,918,051 | 11/1975 | Bernin et al. . |
| 3,973,256 | 8/1976 | Stoesser ........................ 340/365 E |
| 3,978,474 | 8/1976 | Engstrom . |
| 4,007,443 | 2/1977 | Bromberg . |
| 4,106,011 | 8/1978 | Melanson et al. . |
| 4,199,750 | 4/1980 | Taguchi ........................ 340/365 E |
| 4,211,915 | 7/1980 | Miller et al. . |
| 4,231,016 | 10/1980 | Ueda . |
| 4,293,849 | 10/1981 | Lacy . |
| 4,420,744 | 12/1983 | Jesson ........................ 340/365 S |

FOREIGN PATENT DOCUMENTS

| | | | |
|---|---|---|---|
| 971883 | 7/1975 | Canada ........................... 340/365 E |
| 89646 | 9/1983 | European Pat. Off. ........ 340/365 E |

OTHER PUBLICATIONS

Bland and Bolt, "Phantom Key Detection/Phantom Key Scan Code", *IBM Technical Disclosure Bulletin*, vol. 27, No. 7A, Dec. 1984.

Primary Examiner—John W. Caldwell, Sr.
Assistant Examiner—Michael F. Heim
Attorney, Agent, or Firm—Dorsey & Whitney

[57] ABSTRACT

A keyboard or switch matrix key closure validation device and method for a terminal, calculator, desktop computer, or the like is described. The keyboard or switch matrix consists of a matrix of momentary switching elements on "keys" whose number is larger than the number of rows or number of columns in the matrix. A microprocessor provides sequential scanning of the keys in the matrix. The microprocessor also provides detection of closed keys. Upon such detection the microprocessor performs a test for protection against pseudo keys, a debounce test and a detease test. Pseudo key protection is accomplished without each matrix key location having an associated isolation diode. Debounce testing is performed with an extendable bounce period.

12 Claims, 3 Drawing Figures

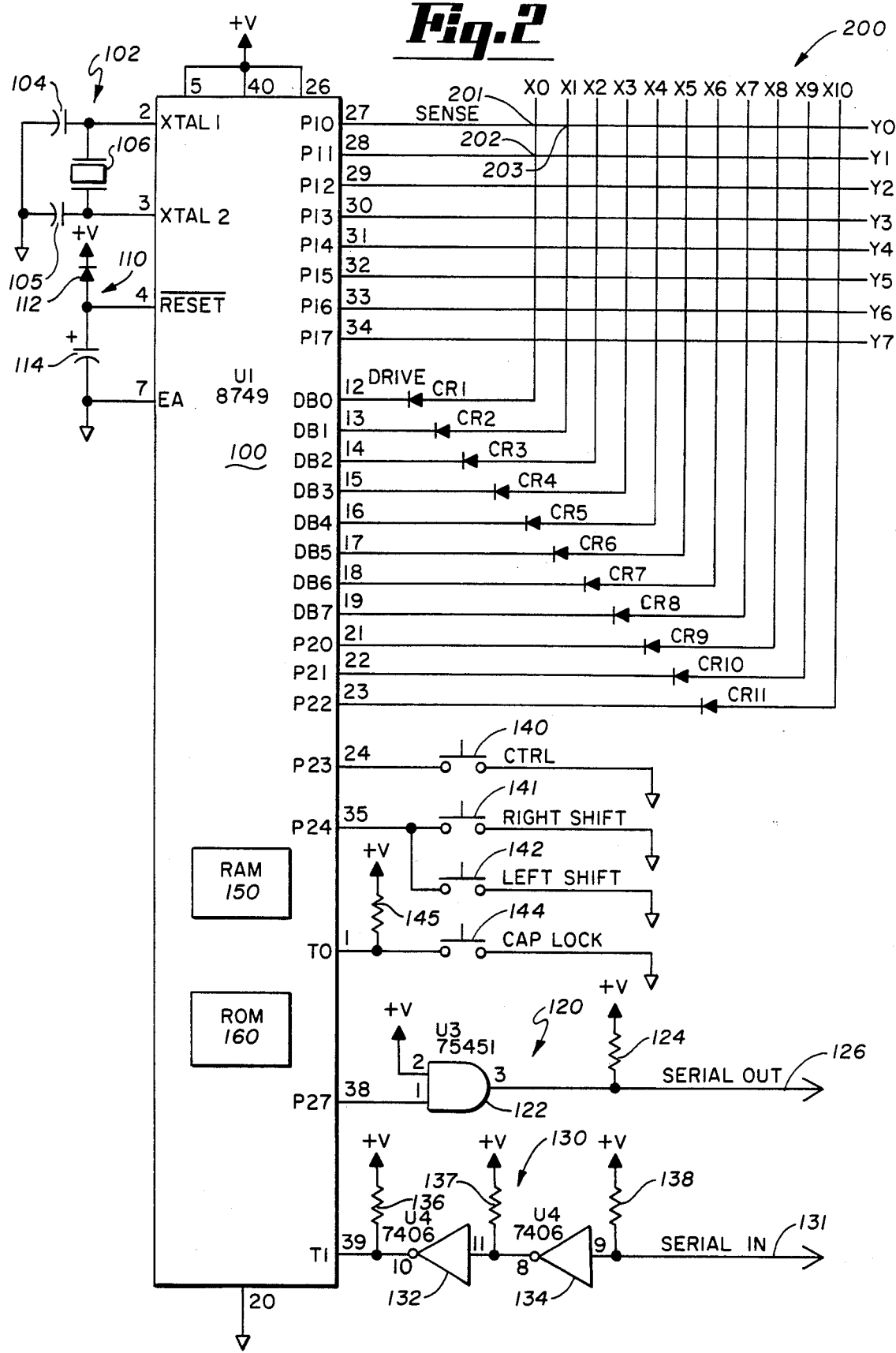

SWITCH MATRIX KEY CLOSURE VALIDATION DEVICE AND METHOD

BACKGROUND OF THE INVENTION

1. Field of the Invention

This invention relates to electronic keyboards which consist of a number of switches or keys. More particularly, the invention relates to a key closure validation device and method for such a keyboard which prevents recognition of pseudo keys and validates a key closure for keycode transmission only after bounce and tease tests are passed.

2. Description of the Prior Art

Conventional keyboards frequently have a plurality of momentary mechanical contact keys. These are usually represented schematically as a switch matrix having rows and columns, although the actual physical arrangement is usually different. Keys are sequentially scanned to detect closures at a rate determined by hardware or, more recently, by microprocessor firmware. Because an operator may have more than one key down at any one time, it has been necessary to provide circuitry to determine which key closures are valid. So called "N-key rollover" keyboards have been developed to handle multiple key closures, but these have increased the need to distinguish between valid and invalid key closures. Such N-key matrices have heretofore used isolations diodes for each key in the matrix to prevent the occurrence of one type of problem, a possible "pseudo key" validation. An alternative method used to prevent occurrence of a possible pseudo key validation was to never validate more than two key closures at one time in the matrix. A third method was to validate multiple key closures only if they all appear in one column of the matrix with no concurrent key closures on other columns.

These prior art arrangements had disadvantages. Use of isolation diodes increased cost and likelihood of component failure. Use of the one-key-only or one-column-only validation criteria caused operator frustration and decreased throughput, where particularly speedy operators could, in fact, have valid keystrokes which would not be accepted under these criteria. While the one column test permitted multiple-key validation in one dimension (columns), its implementation in the prior art prevented multiple key validation in the other dimension (rows) within a single scan of the matrix.

Other prior art key closure validation circuits have also dealt with the problem of key bounce or chattering. The common approach to this problem has been to verify a key closure detection by checking for closure again after a fixed interval. The drawback of such a fixed interval is that different keys may have different bounce characteristics and such characteristics may change over time. A fixed interval fails to accomodate these differences.

SUMMARY OF THE INVENTION

The device aspect of the invention involves a signal validation circuit for a switch matrix of the type having a plurality of switching elements arranged in an electrical matrix having rows and columns. The switching elements are connected across the intersection points of the switch matrix. The invention has key closure detection means including (i) drive signal means connected to the columns of the switch matrix for selectively generating and communicating a drive signal to each of the switching elements in a selected column of said matrix, and (ii) signal detection means connected to the rows of the switch matrix for detecting the appearance of the drive signal on one or more of the rows. A first pseudo key protection means communicates with the key closure detection means. This first protection means permits validation of the closed status of a key without issuance of further drive signals to any other column when the key closure detection means indicates that there is only one closed key in a column to which a drive signal has been communicated. A second pseudo key protection means also communicates with the key closure detection means. The second protection means permits validation of the closed status of multiple keys in a column to which a drive signal has been communicated, but only when a check of all other columns by the key closure detection means indicates no key closures in all other columns.

As a method, the invention involves protecting against the validation of pseudo key closures in the same type of switch matrix. The steps of the method include (a) generating and communicating to a selected column of switch elements in the switch matrix a drive signal and (b) selectively testing for the appearance of the drive signal on one or more rows of the switch matrix. Thereafter the method proceeds by signaling the occurrence of a key closure without generating and communicating further drive signals to any other columns, when the testing of step (b) indicates that the drive signal appears on only one row of the selected column to which the drive signal was sent. Alternatively, the method leads to signaling the occurrence of multiple key closures when the testing of step (b) indicates that the drive signal appears on more than one row of the selected column to which the drive signal was sent, but only after steps (a) and (b) are performed as to each other column and the performance of step (b) indicates no other appearances of the drive signal in any other column.

Both the device and method of the present invention also contemplate a bounce test, which also must be passed before a key closure is fully validated. This test uses an extendable bounce period, such that a key which is still bouncing is given additional time to reach a stable open or closed state.

The principal objectives of the invention are: (a) to provide a keyboard closure validation device and method which prevents validation of pseudo key closures without using an isolation diode for each key; (b) to provide such a device and method with pseudo key protection which permits handling of multiple key closures on both rows and columns in a single scan of the matrix; (c) to provide such a device and method which permits greater throughput; (d) to provide such a device and method which further includes debounce testing using an extendable bounce timing period; (e) to provide such a device and method which further includes detease testing; and (f) to provide such a device and method which can be realized by using a microprocessor to drive and sense keys and to perform pseudo key protection, debounce and detease tests.

These and other objectives of the invention may be more clearly understood by reference to the following drawings and the accompanying description.

BRIEF DESCRIPTION OF THE DRAWINGS

FIG. 2 is an electrical schematic of the major components of the present invention, with a switch matrix as in FIG. 1A depicted without the individual switches at each intersection of the matrix.

DESCRIPTION OF THE PREFERRED EMBODIMENT

Figure 1A:
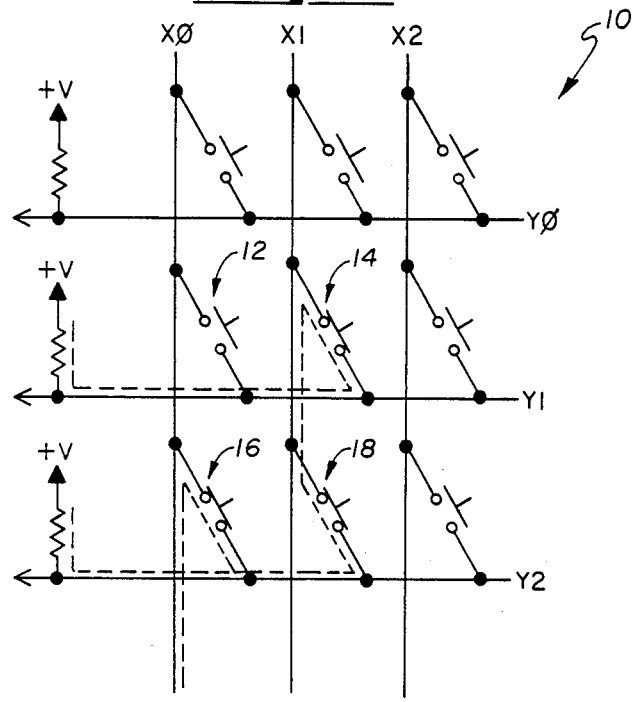
FIG. 1A is an electrical schematic of a 3×3 switch matrix, showing the sneak current path of a "pseudo key".

FIG. 1A shows an example of a 3×3 switch matrix of the type with which the invention is concerned. It will be clear that the principles presented in the context of this 3×3 example are applicable to larger matrices and to those in which the number of rows and columns are not equal.

The switch matrix 10 in FIG. 1 has three driven lines, X0, X1 and X2 and three sensed lines, Y0, Y1 and Y2. These intersect to form a switch matrix which has the Y-lines as its rows and the X-lines as its columns. At each of the intersection points is a switch which, when closed, connects an X-line to a Y-line.

In such a switch matrix the possibility of a "pseudo key" exists whenever three or more switches are closed. A pseudo key is a switch that appears to be closed, because its sensed or Y-line is in the voltage state (high or low) that would indicate a closed switch. The reason the key is called a pseudo key is because the switch is not really closed. The pseudo key condition occurs because certain current paths exist through other switches that are actually closed.

An example of a pseudo key is shown in FIG. 1A for the situation where keys 14, 16 and 18 are closed. The pseudo key appears when the X0 line is driven (by pulling it low), because a sneak current path (indicated by the dotted line) exists through keys 14, 16 and 18. Key 16 is legitimate and should be recognized as closed when the X0 line is driven, but key 12 is not closed. Because the path through keys 14, 16 and 18 causes line Y1 to go low, it looks as if key 12 is also closed. This condition can occur at any site in the matrix where three keys down are located on three corners of a square or rectangle in the matrix; thus, the keys that are down need not be adjacent. The key at the fourth corner of the square or rectangle is the potential pseudo key.

Figure 1B:
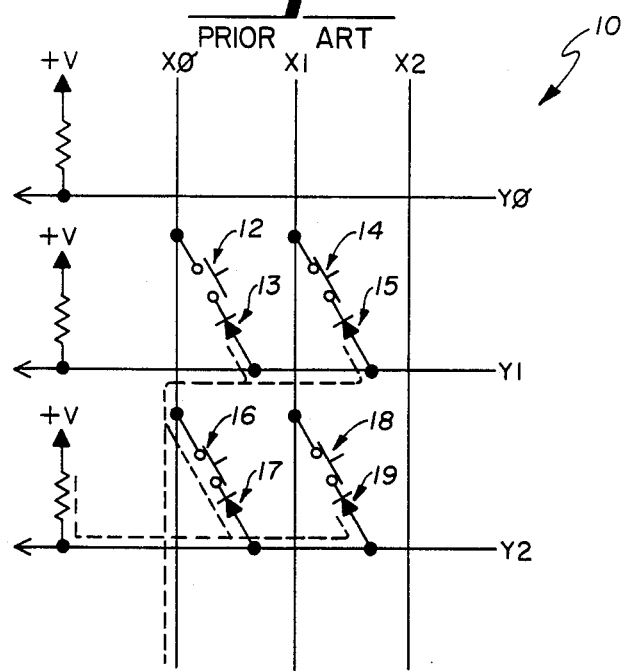
FIG. 1B is an electrical schematic of a 3×3 switch matrix, showing how diodes have been used in the prior art to protect against a "pseudo key".

FIG. 1B shows the same switch matrix as in FIG. 1A except that only keys 12, 14, 16 and 18 are shown and pseudo key protection or blocking diodes 13, 15, 17 and 19, as known in the prior art, are shown inserted, one at each key. The dotted lines show how the sneak current path which existed in FIG. 1A is blocked by the diodes. As noted above, the problem with this method is that it involves higher component and labor costs and also increases the risk of component defects or failures by the failure and defect rate of the diodes.

FIG. 2 shows a larger switch matrix 200 of the type which is normally used for computer keyboards or other equipment where a full set of alphanumeric characters and special symbols is used. Connected to this switch matrix 200 is a microprocessor 100 with associated circuitry, as used to realize the present invention. The switch matrix 200 is an 11×8 matrix in which the individual switches are not shown, for the sake of simplicity and clarity. The individual switches which would connect between an X-line and a Y-line at each intersection, e.g., intersections 201, 202, 203, in the matrix 200, would be connected in the same manner as those shown in FIG. 1A.

The microprocessor 100 is of the conventional 8-bit type such as that designated UI8749. It has an internal random access memory (RAM) 150 and an internal read-only memory (ROM) 160. It is clocked by clock generator circuit 102 connected at pins 2 and 3. This circuit includes a 6 MHz crystal 106 connected between pins 2 and 3, the terminals of which are also grounded via 10 pf capacitors 104, 105. A 5 volt power supply is connected at pins 5, 40 and 26. (All other +V symbols also indicate 5 volt supplies.) Reset circuitry 110 consisting of IN4148 diode 112 and 1.0 microfarad capacitor 114 is connected at pins 4 and 7. The reset circuitry is used to restart the microprocessor 100 at its first instruction.

The driven lines X0 to X10 are connected to the microprocessor 100 at pins 12–19 (DB0–DB7) and 21–23 (P20–P22) via IN4148 diodes CR1–CR11. The single diodes are used to isolate each X-line from other X-lines. This prevents an X-line that is pulled low by a drive signal from being pulled high when keys on multiple X-lines are depressed, thus electrically shorting together several X-lines in the matrix 300. In this configuration, driving the X-lines requires a full 8-bit data bus and three additional lines on another output port. In order to reduce the number of such lines needed, a demultiplexer could be used. For example, with a U274154 demultiplexer, a 4-bit binary coded input from four output lines on the microprocessor 100 could be used to selectively drive up to sixteen X-lines on its output side. Except for the reduced number of output ports and the insertion of the demultiplexer between the four output ports and the diodes CR1–CR11, the same arrangement would be used for connecting the X-lines to the microprocessor 100 as appears in FIG. 2.

Other connections to the microprocessor appear at pins 24, 35 and 1, which handle the keyboard's special keys. Pin 24 (P23) accepts input from the keyboards CTRL key 140. Pin 35 (P24) accepts input from either the RIGHT SHIFT key 141 or LEFT SHIFT key 142. Pin 1 (TO) accepts input from the CAP LOCK key 144, aided by 10K pull-up resistor 145.

The serial output of keycodes corresponding to the key in matrix 100 which has been depressed, in accordance with the keycode assignments particular to the keyboard and its required output codes (e.g., ASCII, EBCDIC) appears at pin 38 (P27) by means of serial output circuit 120. This circuit includes a buffer 122 (a U375451 AND-gate) and a 3.3K pullup resistor 124. The serial output is delivered to a display, a host computer, or other receiving device (not shown) via SERIAL OUT line 126.

Should it be desired to communicate information from a host computer or other source to the microprocessor 100, this occurs at pin 39 (T1) by means of serial input circuit 130. The input signal appears on SERIAL IN line 131 and passes through buffers 132 and 134 (U47406 inverters), with the aid of three 3.3K pullup resistors 136, 137 and 138.

Operation of the invention is governed by a computer program which is stored in ROM 160, the microprocessor's firmware. The specific details of the program can vary, of course, depending on the microprocessor type and on the desired characteristics and features for the keyboard. The basic approach to pseudo-key protection, debounce testing and detease testing is, however, consistent throughout various embodiments of the invention. An example of a suitable program as adapted to the embodiment of the invention as shown in FIG. 2 is included in this Specification as Appendix A, immediately preceding the claims. While the detailed program logic can be determined by reference to Appendix A, the general flow of logic will be described next.

Key Closure Detection Routine

In the active state of scanning the matrix 200 for key closure detection, one and only one of the X-lines is driven at any one time. To do this, one X-line is pulled to ground by a "low" logic signal issued by the microprocessor's sequential key closure detection routine. With no key closures, all of the rows or Y-lines in the matrix 300 are pulled "high" to a positive voltage source through internal pullup resistors located in the microprocessor 100. When a key is pushed down to close its contacts, the matrix intersection corresponding to that key is shorted together, and when that key's particular column is enabled during the scanning sequence, the "low" level of the drive signal will be communicated to the attached row or Y-line. The high or low states of the matrix Y-lines are thus simultaneously inputted into the microprocessor 100, where they are temporarily stored in one byte, representing the closed or unclosed status of all keys in the X-line currently being driven (including possible pseudo keys).

Pseudo Key Protection Routine

Pseudo key protection is performed by the microprocessor and its firmware 100 in two steps or levels. First, the microprocessor 100 determines if there is only a single key closed on the currently driven X-line. If so, then no psuedo key can be present. The old key/new key routine (described next) is invoked, and further steps toward validation and transmission of a keycode are permitted to proceed directly, without attempting to detect key closures on any other X-line. That is, if the other, later validation tests are passed, a keycode for the single closed key will be transmitted without scanning the rest of the matrix.

If there is more than a single key closed on the currently driven X-line, then a possible pseudo key condition exists and further validation cannot yet proceed. Instead, the second level of pseudo-key protection is invoked in the form of program steps which drive each of the other X-lines (in wraparound fashion, if the current X-line was not X0) to see if any other key is closed. If no other closed key is found on X-lines other than the currently driven X-line, then further steps can be taken to validate the multiple closed keys on the currently-driven X-line. This is done by processing the keys in turn through the old key/new key routine (described next).

If it is found that other X-lines in the matrix 300 also have keys down, then no validation of any keys in the currently-driven X-line proceeds, and control is passed back to the key closure detection routine, which again attempts to detect closed keys in the same X-line. The two levels of pseudo key protection will again be used to see if the possible pseudo key condition has disappeared, because of a change in status of the keys involved. If a possible pseudo key condition still exists, no key will be validated and transmitted and the keyboard will appear locked. The change in status to remove the apparent locked condition may occur in two possible ways. Either one or more keys on the currently-driven X-line opens so that only a single key or no keys are closed on the currently-driven line; or all the keys which are closed on other X-lines in the matrix (other than the currently-driven X-line) open. The occurence of either event will cause either the first or second level of pseudo key protection to be satisfied, because it is no longer possible that a pseudo key will be validated.

Old Key/New Key Routine

To reach this point in the firmware and program logic, one of the two levels of pseudo key protection will have been passed. At least one key on an X-line has been detected as closed. The next step towards validation is to determine that at least one key closure detected is a "new" key closure and not an "old" key closure, i.e., a key that was previously validated and transmitted but is still closed. To accomplish this, the firmware refers to a vectored array maintained in the microprocessor's RAM 150 which is used to store, in one bit per key, status information on which keys are closed and fully validated such that a keycode has been transmitted. This vectored array is a two-dimensional array with X and Y components. It is initialized to show no keys validated. The X component relates directly to the X-lines or columns or driven lines of the matrix 200. The Y component represents the Y-lines or rows or sensed lines in the matrix 200. Maintained under microprocessor control, the two dimensional array is an image of the real-time status of the open or closed and validated condition of each key in the matrix 200 validated since the last time the various X-line images were updated.

The old key/new key routine takes the temporarily stored image of the currently driven X-line and compares it to the RAM image for the same X-line, bit-by-bit, i.e., key-by-key. If the compare operation finds a detected key closure that is a new key closure, then control is passed to the debounce routine for further steps toward validation of that key. (Other possible key closures on that same column will not be debounced until the next scan of the column.) If the compare operation indicates that all detected key closures have been previously validated and transmitted and the keys have not been detected as open since, all key closures are "old" and control is passed back to the closure detection routine for key closure detection on the next X-line (with wraparound if the last X-line was X10). If there are multiple key closures, an "old" key may be noted and passed over before a "new" key is found. Before passing control, the old key/new key routine updates the RAM image of the currently driven X-line, so that any key shown in RAM 160 as closed which is now detected as open is marked as open.

Debounce Routine

To reach this point in the firmware, the first and second levels of pseudo key protection have been satisfied and a detected key closure has been found to be a "new" closure. The debounce routine uses a dynamic or extendable counter (timer) to delay key closure validation, until the key contacts have stopped "chattering" and have settled into a stable closed state. If the key contacts fail to close for a long enough period of time to meet the minimum debounce test time, and then the contacts stay open, the debounce routine will return control to the closure detection routine, blocking further validation of the key closure which failed the debounce test.

The time-extendable debounce routine works as follows. The real-time status of the key contacts is repeatedly monitored by the closure detection firmware of microprocessor 100. A status detection counter which is set with an initial value of 25 (corresponding to 4.4 ms. in the preferred embodiment, given the known firmware execution times) is used to count downward. If the real-time status of the key contacts continues to show the key as closed, then the key is considered to have passed the debounce test after 25 consecutive status checks showing a closed key. If the real-time status of the key at any point shows that the key was closed but is now open, the status detection counter is augmented by the addition of a fixed increment of 5 (corresponding to 1.1 ms in the preferred embodiment.) (Another loop limit ensures that the status detection counter does not grow too large, by inhibiting addition at a predetermined level.) If the counter detects 25 consecutive key open states, the debounce test is failed and control is returned to the closure detection routine to resume with the next X-line.

If the key closure is considered to have passed the debounce test, control is passed to the detease routine (described next). Indefinite looping in the debounce test is avoided, because it is not normally physically possible for an operator to keep a key bouncing.

It should be noted that because the debounce test aspect of the invention is implemented in firmware, the invention can be adapted to expected bounce characteristics by selection of the initial value of the status detection counter and the value by which the counter is augmented.

Detease Routine

To reach this point in the firmware, the first and second levels of pseudo key protection have been satisfied, a key closure has been found to be a new key closure and it has passed the debounce test. This routine is designed to detect whether the key being validated has been closed just to the point whether the contacts are continuously making and breaking, such that the apparent new closure is spurious. Before entering this routine, a check is made to see if the detease test is even necessary. If the key which has just passed the debounce test is not the same as the key most recently validated and transmitted, then there can be no question of teasing. In this case the key closure is now validated and the update and transmit routine can be entered. If, on the other hand, the key about to be validated was just validated and transmitted, the detease test must be passed before the keycode will be transmitted again. The detease test consists of determining whether the chosen detease period (80 ms in the preferred embodiment) has elapsed since the previous validation and transmission of the same key. If this time period has not elapsed, the key closure fails validation, and control is returned to the scan routine to resume with the next X-line. If the detease test is passed, the key closure is now validated and the update and transmit routine can be entered.

Update and Transmit Routine

This part of the firmware is only reached when the key has been fully validated and is ready to have its keycode transmitted. The first step is to update the real-time RAM image for this key to show that it has been validated. Once this is done, the microprocessor 100 must check the status of special keys to see if the CTRL, SHIFT or CAP LOCK keys are depressed. If so, additional status bits are noted, which, along with the X-line and Y-line coordinates of the validated key (formed into a single number as an X-Y address), determine the keycode to be transmitted. The keycode itself is located in the conventional manner by table lookup or a combination of table lookup and code generation. Once the keycode corresponding to the closed key and any special keys is found, it is placed in a buffer for serial transmission by the serial output circuit 120, with the microprocessor 100 governing the timing of transmission. Control is returned to the closure detection routine to resume scanning at line X0.

As can be seen from the preceding, the present invention involves an improved device and method for switch matrix closure validation. To prevent pseudo keys, it uses a two level test for pseudo key detection. This permits it to handle multiple key closures on any column or single keys on consecutively scanned columns. If a single key closure is found in a column, it can proceed through validation and eventual transmission without the need for scanning any other columns. Thus, the invention handles multiple key closures in both X and Y dimensions.

As can be further seen, the invention also involves an improved device and method for separating valid key closures from key bounce. This debounce arrangement uses an extendable debounce period which is incremented when the key bounces between closed and open states so that no validation can occur unless and until the key stably closes. The advantage of that approach as compared to a single, fixed debounce period is that different keys may have different bounce characteristics and these may change over time. In particular, it is typical that bouncing grows worse as keys age. The present arrangement adapts automatically to contact degradation and increased bounce.

It will be obvious to one skilled in the art that a number of modifications can be made to the above described preferred embodiment without essentially changing the invention. Accordingly, while the preferred embodiment of the invention has been described and illustrated, it is to be understood that the invention is not limited to the precise construction herein disclosed and the right is reserved to all changes and modifications coming within the scope of the invention as defined in the appended claims.

A listing of the firmware program used in the preferred embodiment follows as Appendix A, preceding the claims.

Having thus described the invention, what is claimed as new and desired to be protected by Letters Patent, is:

1. A signal validation circuit for a switch matrix of the type having a plurality of switching elements arranged in an electrical matrix having rows and columns, said switching elements being connected across the intersection points of the switch matrix and being actuated by a key closure, comprising:
(a) key closure detection means including
 (i) drive signal means connected to the columns of the switch matrix for selectively generating and communicating a key closure detection drive signal to each of the switching elements in a selected column of said matrix, and (ii) signal detection means connected to the rows of the switch matrix for detecting the appearance of the drive signal on one or more of the rows in the selected column of the matrix to which the drive signal has been communicated;

(b) first pseudo key protection means communicating with said key closure detection means to analyze the number of key closures in a current selected column, said first protection means enabling validation of the closed status of a key in the current selected column without issuance of further key closure detection drive signals to any other column when the key closure detection means indicates that there is only one closed key in the current selected column; and (c) second pseudo key protection means for receiving control from said first pseudo key protection means when more than one key closure is detected in the current selected column and communicating with said key closure detection means to initiate issuance of key closure detection drive signals to columns other than the current selected column, said second protection means enabling validation of the closed status of multiple keys in the current selected column only when a check of all other columns by said key closure detection means indicates no key closures in all other columns.

2. The circuit as recited in claim 1, wherein the key closure detection means, and first and second pseudo key protection means are implemented by a microprocessor and firmware.

3. The circuit as recited in claim 2 wherein the microprocessor maintains a real time image of which keys have been detected as closed and also validated and which have not.

4. The circuit as recited in claim 1 further comprising debounce test means connected to the key closure detection means which repeatedly checks the status of a key detected as closed and prevents validation of a key detected as closed unless it remains closed for an extendable debounce period, which is extended beyond a specified base debounce period when the key closure detection means detects that the key detected as closed is now open.

5. The circuit as recited in claim 4 wherein the debounce test means is implemented in a microprocessor and firmware, said extendable debounce period being defined in a counter which is decremented at each repeated detection of key closed status and incremented when the key detected as closed is later detected as open.

6. The circuit as recited in claim 5 wherein the debounce test means includes means for limiting the size of the extendable debounce period.

7. The circuit as recited in claim 5 wherein the base debounce period may be adjusted by specifying a different value in the firmware.

8. The circuit as recited in claim 5 further comprising detease means for preventing validation of a key closure when less than a predetermined detease time period has elapsed since a prior closure of the key detected as closed was validated.

9. The circuit as recited in claim 1 wherein the key closure detection means is implemented by a microprocessor, the rows of the switch matrix being connected to input ports of the microprocessor and pulled to a high logic level and the columns of the switch matrix being connected to output ports of the microprocessor which are selectively pulled to a low logic level to communicate a drive signal.

10. A method for validation of key closures in a switch matrix of the type having a plurality of switching elements arranged in an electrical matrix having rows and columns, with said switching elements being connected across the intersection points of the switch matrix and being actuated by a key closure, comprising:

(a) generating and communicating to a current selected column of switch elements in the switch matrix a key closure detection drive signal;

(b) selectively testing for the appearance of the key closure detection drive signal on one or more rows of the current selected column in the switch matrix;

(c) signaling the occurrence of a key closure without generating and communicating key closure detection drive signals to any other columns when the testing of step (b) indicates that the key closure detection drive signal appears on only one row of the current selected column to which the key closure detection drive signal was sent; and (d) signaling the occurrence of multiple key closures in the current selected column when the testing of step (b) indicates that the key closure detection drive signal appears on more than one row of the current selected column to which the key closure detection drive signal was sent, but only after steps (a) and (b) are performed as to each other column and the performance of step (b) on each other column indicates no other appearances of the key closure detection drive signal in any other column.

11. The method as recited in claim 10 further comprising: debounce testing a key closure signaled as a result of step (c) or (d) by repeatedly observing the open or closed status of a key detected as closed during an extendable debounce period, and signaling the occurrence of a debounced key closure when the key detected as closed remains closed for the entire extendable debounce period.

12. The method as recited in claim 10 further comprising: setting a fixed base value in a debounce timer; repeatedly observing the open or closed status of a key detected as closed as a result of step (c) or (d) until the debounce timer expires; incrementing the debounce timer when a key previously detected as closed is detected as open at the next observation; and signaling the occurrence of a debounced key closure when the key detected as closed remains closed for the entire extendable debounce period.

* * * * *